(12) United States Patent
Kato

(10) Patent No.: US 11,710,633 B2
(45) Date of Patent: Jul. 25, 2023

(54) DEPOSITION METHOD AND DEPOSITION APPARATUS

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 35 days.

(21) Appl. No.: 17/155,551

(22) Filed: Jan. 22, 2021

(65) Prior Publication Data

US 2021/0249265 A1 Aug. 12, 2021

(30) Foreign Application Priority Data

Feb. 6, 2020 (JP) .................................. 2020-019152

(51) Int. Cl.

| | |
|---|---|
| *H01L 21/3213* | (2006.01) |
| *H01L 21/02* | (2006.01) |
| *H01L 21/3065* | (2006.01) |
| *C23C 16/56* | (2006.01) |
| *C23C 16/458* | (2006.01) |
| *C23C 16/455* | (2006.01) |
| *C23C 16/52* | (2006.01) |
| *C23C 16/24* | (2006.01) |

(52) U.S. Cl.
CPC ........ *H01L 21/02532* (2013.01); *C23C 16/24* (2013.01); *C23C 16/4584* (2013.01); *C23C 16/45544* (2013.01); *C23C 16/52* (2013.01); *C23C 16/56* (2013.01); *H01L 21/02645* (2013.01); *H01L 21/3065* (2013.01)

(58) Field of Classification Search
CPC ................ H01L 21/32137; H01L 21/32055
See application file for complete search history.

(56) References Cited

U.S. PATENT DOCUMENTS

| | | | | |
|---|---|---|---|---|
| 2004/0063328 A1* | 4/2004 | Wen | .................. | H01L 21/32137 438/706 |
| 2008/0142483 A1* | 6/2008 | Hua | .................... | H01L 21/3145 216/67 |
| 2014/0113436 A1* | 4/2014 | Kato | ....................... | C23C 16/24 118/719 |
| 2019/0348278 A1* | 11/2019 | Motoyama | .......... | H01L 21/3065 |

FOREIGN PATENT DOCUMENTS

JP 2014-082419 5/2014

\* cited by examiner

*Primary Examiner* — Thomas T Pham
(74) *Attorney, Agent, or Firm* — IPUSA, PLLC

(57) ABSTRACT

A method of depositing a silicon film on a recess formed in a surface of a substrate is provided. The substrate is placed on a rotary table in a vacuum vessel, so as to pass through first, second, and third processing regions in the vacuum vessel. An interior of the vacuum vessel is set to a first temperature capable of breaking an Si—H bond. In the first processing region, $Si_2H_6$ gas having a temperature less than the first temperature is supplied to form an $SiH_3$ molecular layer on its surface. In the second processing region, a silicon atomic layer is exposed on the surface of the substrate, by breaking the Si—H bond in the $SiH_3$ molecular layer. In the third processing region, by anisotropic etching, the silicon atomic layer on an upper portion of an inner wall of the recess is selectively removed.

10 Claims, 8 Drawing Sheets

DEPOSITION METHOD AND DEPOSITION APPARATUS

CROSS-REFERENCE TO RELATED APPLICATIONS

This patent application is based upon and claims priority to Japanese Patent Application No. 2020-019152 filed on Feb. 6, 2020, the entire contents of which are incorporated herein by reference.

TECHNICAL FIELD

The present disclosure relates to a deposition method and a deposition apparatus.

BACKGROUND

A technique is known, in which a silicon film is formed on a substrate in a generally cylindrical vacuum vessel, by repeating a step of forming a molecular layer of $SiH_3$ on a surface of the substrate and a step of breaking Si—H bonds in the molecular layer to leave only a silicon atomic layer on the surface (see Patent Document 1, for example).

RELATED ART DOCUMENT

Patent Document

[Patent Document 1] Japanese Laid-open Patent Application Publication No. 2014-082419

SUMMARY

The present disclosure provides a technique for bottom-up growth of a silicon film of a good quality in a recess.

According to one aspect of the present disclosure, a method of depositing a silicon film on a recess formed in a surface of a substrate is provided. The substrate is placed on a rotary table in a vacuum vessel, so as to pass through first, second, and third processing regions provided in the vacuum vessel separately from each other. An interior of the vacuum vessel is set to a first temperature at which an Si—H bond can be broken. When the substrate passes through the first processing region, $Si_2H_6$ gas having a second temperature less than the first temperature is supplied to form an $SiH_3$ molecular layer on the surface of the substrate. When the substrate passes through the second processing region, the Si—H bond in the $SiH_3$ molecular layer is broken, and a silicon atomic layer is exposed on the surface of the substrate. When the substrate passes through the third processing region, the silicon atomic layer on an upper portion of an inner wall of the recess is selectively removed by anisotropic etching.

DETAILED DESCRIPTION OF EMBODIMENTS

Figure 1:
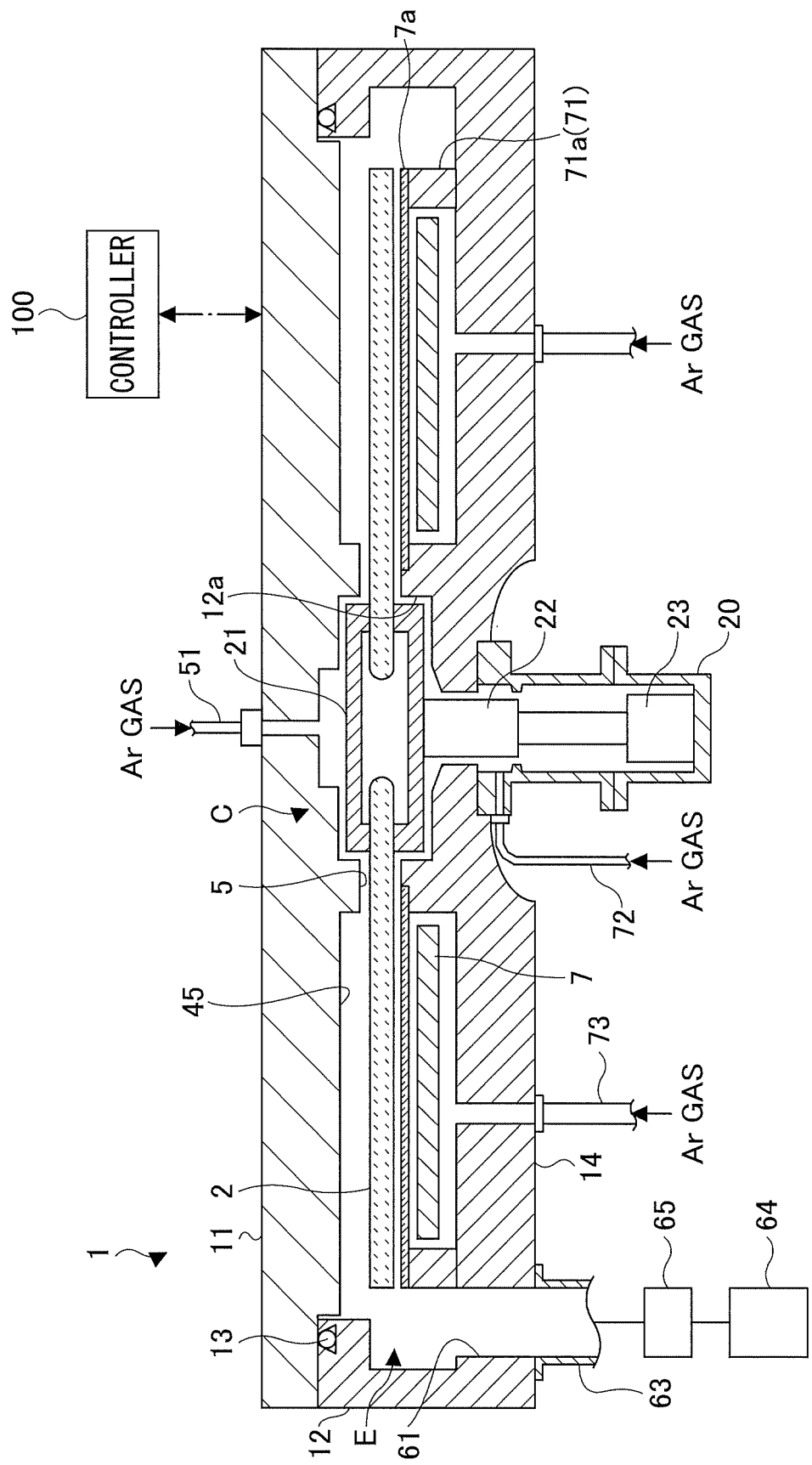
FIG. 1 is a cross-sectional view illustrating an example of a deposition apparatus according to an embodiment.

Hereinafter, non-limiting example embodiments of the present disclosure will be described with reference to the accompanying drawings. In all the accompanying drawings, the same or corresponding reference numerals are assigned to the same or corresponding parts or components, and duplicate descriptions will be omitted.

(Deposition Apparatus)

Figure 2:
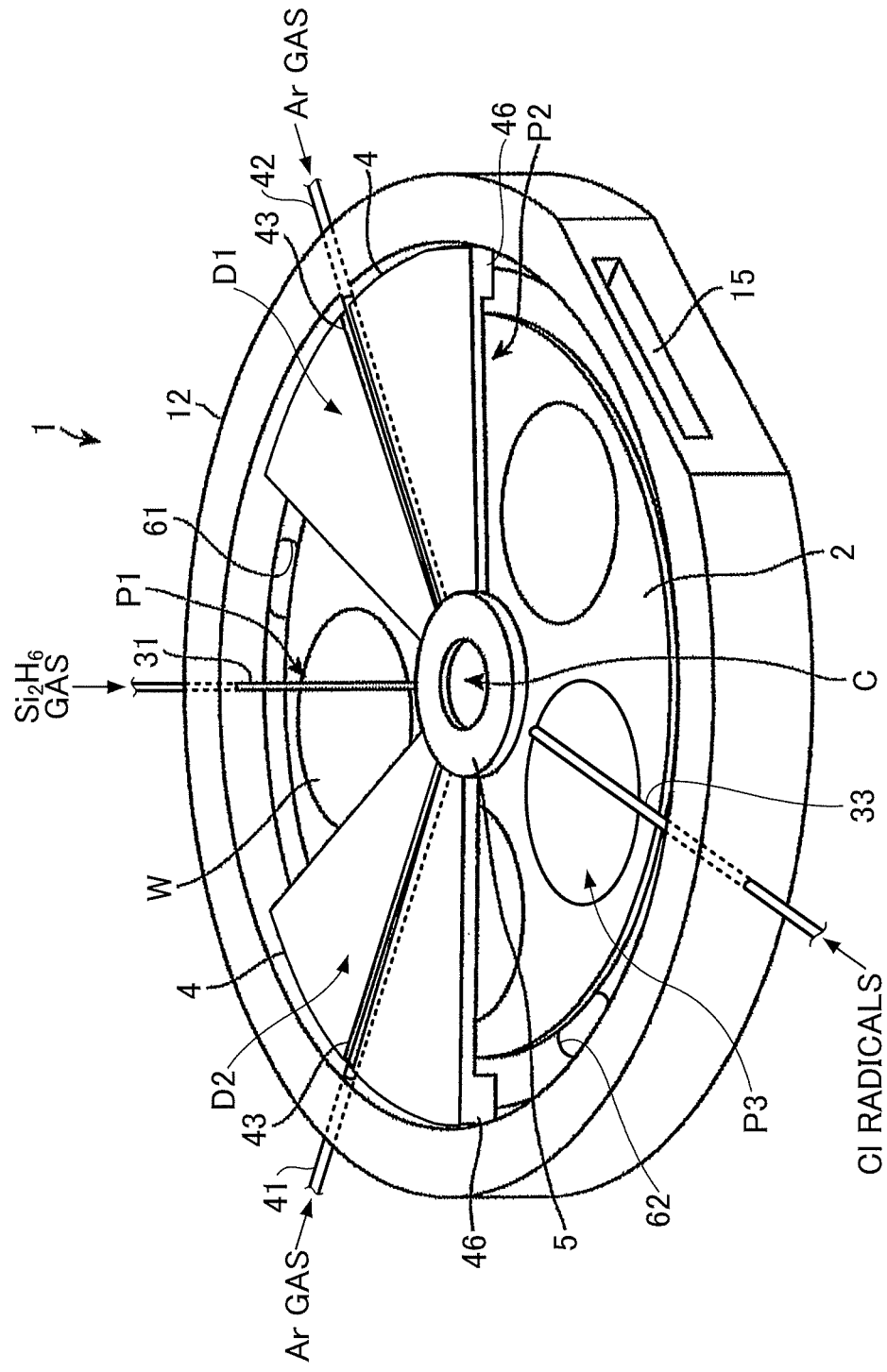
FIG. 2 is a perspective view illustrating an example of the internal configuration of the deposition apparatus in FIG. 1.
Figure 3:
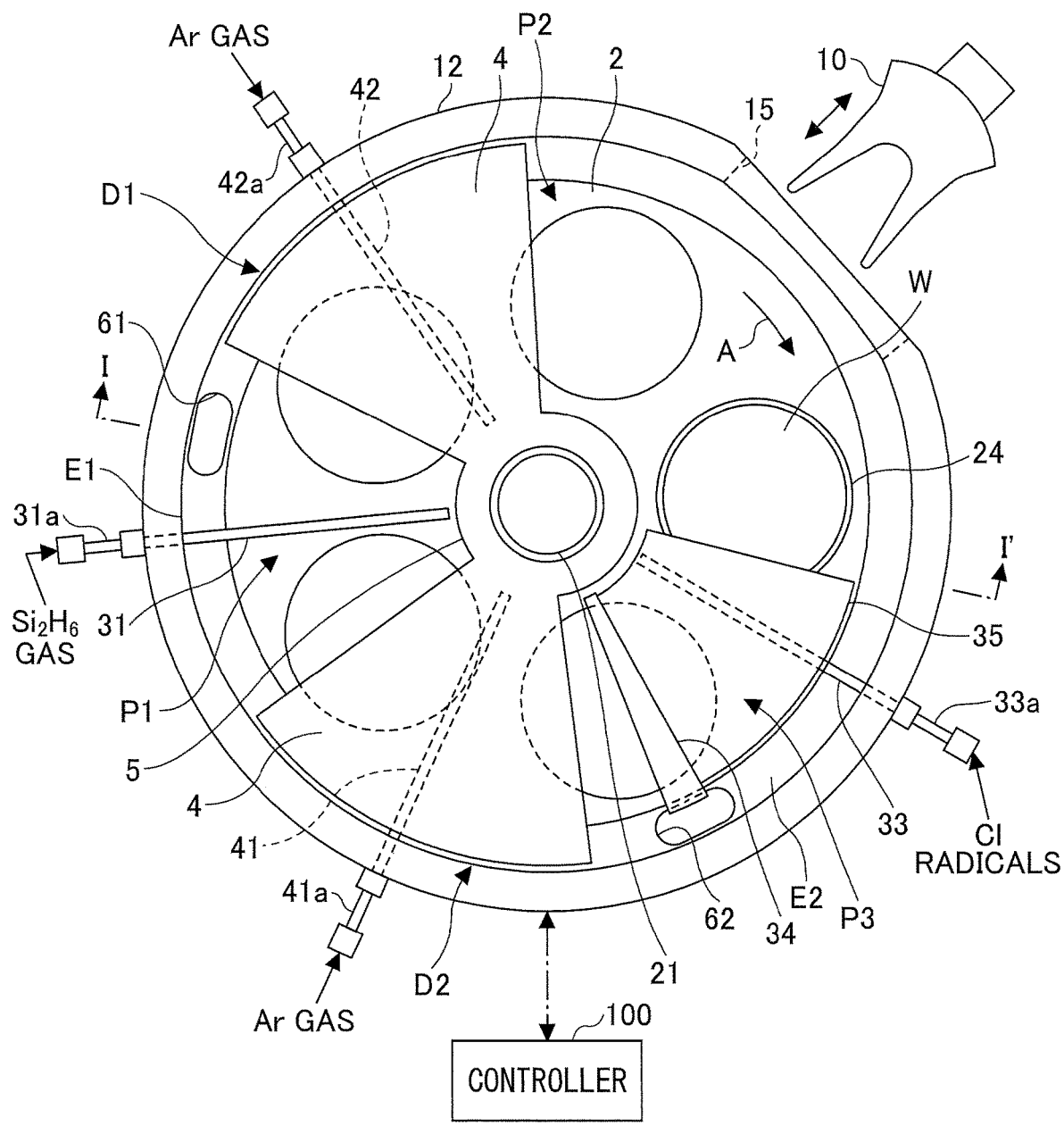
FIG. 3 is a top view illustrating an example of the internal configuration of the deposition apparatus in FIG. 1.

FIG. 1 is a cross-sectional view illustrating an example of a deposition apparatus according to the present embodiment. FIG. 2 is a perspective view illustrating an example of the internal configuration of the deposition apparatus according to the present embodiment. FIG. 3 is a top view illustrating an example of the internal configuration of the deposition apparatus according to the present embodiment.

Referring to FIGS. 1 to 3, the deposition apparatus includes a flat vacuum vessel 1 having a substantially circular planar shape, and a rotary table 2 disposed in the vacuum vessel 1. A center of rotation of the rotary table 2 is at the center of the vacuum vessel 1. As illustrated in FIG. 1, the vacuum vessel 1 includes a vessel body 12 having a cylindrical shape with a bottom, and a top plate 11 which is removably disposed on the upper surface of the vessel body 12 in an airtight manner via a sealing member 13 such as an O-ring.

As illustrated in FIG. 1, the rotary table 2 is fixed to the cylindrical core 21 at the center, and the core 21 is fixed to the upper end of a vertically extending rotating shaft 22. The rotating shaft 22 penetrates the bottom 14 of the vacuum vessel 1, and the lower end of the rotating shaft 22 is attached to a drive section 23 that rotates the rotating shaft 22 about a vertical axis. The rotating shaft 22 and the drive section 23 are accommodated in a cylindrical casing 20 having an open top surface. A flange portion is provided at the upper surface of the casing 20, and the flange portion is hermetically attached to the lower surface of the bottom 14 of the vacuum vessel 1. Thus, the internal atmosphere of the casing 20 is isolated from an external atmosphere.

A heater unit 7 is provided in a space between the rotary table 2 and the bottom 14 of the vacuum vessel 1. The heater unit 7 has an annular shape, and maintains the inside of the vacuum vessel 1 at a constant temperature from below the rotary table 2. In the present embodiment, the inside of the vacuum vessel 1 is maintained at a predetermined temperature at which Si—H bonds can be broken. Specifically, because the Si—H bond is broken at approximately 550° C., the heater unit 7 heats the vacuum vessel 1 such that the inside of the vacuum vessel 1 is approximately 550° C., e.g. 540° C. to 580° C., preferably 550° C. to 570° C.

As illustrated in FIGS. 2 and 3, an upper surface of the rotary table 2 is provided with circular recesses 24 on which multiple (five in the example illustrated) substrates are placed along the rotation direction (the circumferential direction) of the rotary table. In the present embodiment, an example in which a semiconductor wafer (hereinafter, referred to as "wafer W") is used as a substrate will be described. For convenience, the wafer W is illustrated in FIG. 3 only in one of the recesses 24. Each of the recesses 24 has an inner diameter of, for example, 2 mm greater than the diameter of the wafer W, and has a depth approximately equal to the thickness of the wafer W. Therefore, when the wafer W is housed in the recess 24, the surface of the wafer W and the surface of the rotary table 2 (the area in which the wafer W is not placed) become the same height. Through-holes (not illustrated) are formed in the bottom surface of the recess 24 through which, for example, three lift pins penetrate to support the back surface of the wafer W and raise and lower the wafer W. Instead of the recesses 24 on which wafers W are placed, stages may be provided on the rotary table 2 along the circumferential direction of the rotary table 2. Each of the stages is configured such that a wafer W can be placed on each of the stages, and that the stages with wafers placed thereon are rotatable with respect to the rotary table 2.

FIGS. 2 and 3 illustrate the configuration within the vacuum vessel 1, and for the sake of illustration, the top plate 11 is not illustrated. As illustrated in FIGS. 2 and 3, above the rotary table 2, reactant gas nozzles 31 and 33 and separation gas nozzles 41 and 42, which are made of quartz for example, are arranged in a circumferential direction of the vacuum vessel 1 spaced from each other. In the illustrated example, the reactant gas nozzle 33, the separation gas nozzle 41, the reactant gas nozzle 31, and the separation gas nozzle 42 are arranged clockwise from a conveying port 15 in this order. The conveying port 15 will be described below. The reactant gas nozzles 31 and 33 are introduced into the vacuum vessel 1 from the outer peripheral wall of the vacuum vessel 1 by fixing the inlet ports 31a and 33a (FIG. 3), which are the respective proximal ends of the reactant gas nozzles 31 and 33, to the outer peripheral wall of the vessel body 12, and the reactant gas nozzles 31 and 33 are mounted so as to extend horizontally with respect to the rotary table 2, along the radial direction of the vessel body 12. The separation gas nozzles 41 and 42 are introduced into the vacuum vessel 1 from the outer peripheral wall of the vacuum vessel 1 by fixing the inlet ports 41a and 42a (FIG. 3), which are the respective proximal ends of the separation gas nozzles 41 and 42, to the outer peripheral wall of the vessel body 12, and the separation gas nozzles 41 and 42 are mounted so as to extend horizontally with respect to the rotary table 2, along the radial direction of the vessel body 12.

In the present embodiment, the reactant gas nozzle 31 is connected to a source (not illustrated) of diisopropylaminosilane (DIPAS) gas as an aminosilane-based gas, via piping, a flow controller, and the like that are not illustrated. The reactant gas nozzle 31 is connected to a source (not illustrated) of disilane ($Si_2H_6$) gas as a reactant gas through piping, a flow controller, and the like that are not illustrated. The reactant gas nozzle 33 is connected to a source (not illustrated) of chlorine ($Cl_2$) gas as an etching gas via piping, a flow controller, and the like that are not illustrated. The source of chlorine gas generates active species of a chlorine gas (hereinafter referred to as "chlorine (Cl) radicals") by a plasma for example, and supplies the generated chlorine radicals to the reactant gas nozzle 33. Each of the separation gas nozzles 41 and 42 is connected to a source (not illustrated) of argon (Ar) gas as a separation gas via piping, a flow control valve, and the like that are not illustrated.

In the reactant gas nozzle 31, multiple discharge holes 31h (FIG. 4) opening toward the rotary table 2 are arranged along the longitudinal direction of the reactant gas nozzle 31, at an interval of 10 mm, for example. A region below the reactant gas nozzle 31 is a first processing region P1 for causing the wafer W to absorb $SiH_3$, into which $Si_2H_6$ gas is decomposed. A region apart from the first processing region P1, which is provided along the circumferential direction of the rotary table 2 and which is not provided with a gas nozzle, is a second processing region P2 in which H is desorbed from $SiH_3$ having been adsorbed on the wafer W in the first processing region P1. A region apart from the second processing region P2, which is provided along the circumferential direction of the rotary table 2 and which is provided with the reactant gas nozzle 33, is a third processing region P3 in which anisotropic etching is performed.

A fan-shaped straightening plate 35 is provided above the reactant gas nozzle 33 to cover the reactant gas nozzle 33 from the above, and to extend upstream and downstream in the rotational direction of the rotary table 2 (indicated by the arrow A in FIG. 3). Details of the third processing region P3 will be described below.

A first separation region D1 is provided between the first processing region P1 and the second processing region P2. A second separation region D2 is provided between the third processing region P3 and the first processing region P1.

As the rotary table 2 rotates clockwise, the wafer W placed in the recess 24 passes through the first processing region P1, the first separation region D1, the second processing region P2, the third processing region P3, and the second separation region D2 sequentially. At this time, when the wafer W passes through the first processing region P1 while the interior of the vacuum vessel 1 is maintained at a temperature at which an Si—H bond can be broken (approximately 550° C.), $Si_2H_6$ gas is supplied from the reactant gas nozzle 31, and $SiH_3$ formed by pyrolyzing the $Si_2H_6$ gas is adsorbed onto the surface of the wafer W as a molecular layer. Because disilane gas is decomposed into $SiH_3$ at approximately 450° C., the disilane gas easily decomposes at the temperature in the present embodiment, i.e., approximately 550° C. The surface of the wafer W is formed of silicon (Si), and Si on the surface of the wafer adsorbs Si of $SiH_3$ into which a disilane gas is decomposed. Thereafter, as a result of the rotation of the rotary table 2, the wafer W enters the first separation region D1 and the surface of the wafer W is purged with Ar gas. This ensures that no extra molecules are attached to the $SiH_3$ molecular layer, thus maintaining the state of the molecular layer. In other words, no extra chemical vapor deposition (CVD) reaction occurs. The wafer W then enters the second processing region P2 as a result of further rotation of the rotary table 2. The second processing region P2 is not provided with a gas nozzle, and forms a space at a constant temperature. A process of breaking Si—H is performed in the second processing region P2, and only an Si atomic layer remains on the surface of the wafer W. Thereafter, when the wafer W passes through the third processing region P3 as a result of further rotation of the rotary table 2, part of the Si atomic layer is removed by anisotropic etching with chlorine radicals. As a result of further rotation of the rotary table 2, the wafer W enters the second separation region D2 and purge gas is supplied to remove dust and the like from the surface. When the rotary table 2 is further rotated and the wafer W enters the first processing region P1, the silicon atomic layer is formed on the surface, and dust or the like is removed from the surface. Therefore, by repeating the same process again, a silicon film can be formed on the surface of the wafer W.

By performing such a series of processes continuously by rotating the rotary table 2, a silicon film of a desired thickness can be formed on the surface of the wafer W. The deposition apparatus according to the present embodiment is configured to perform such a deposition process. Individual components of the deposition apparatus will be described in more detail below.

Figure 4:
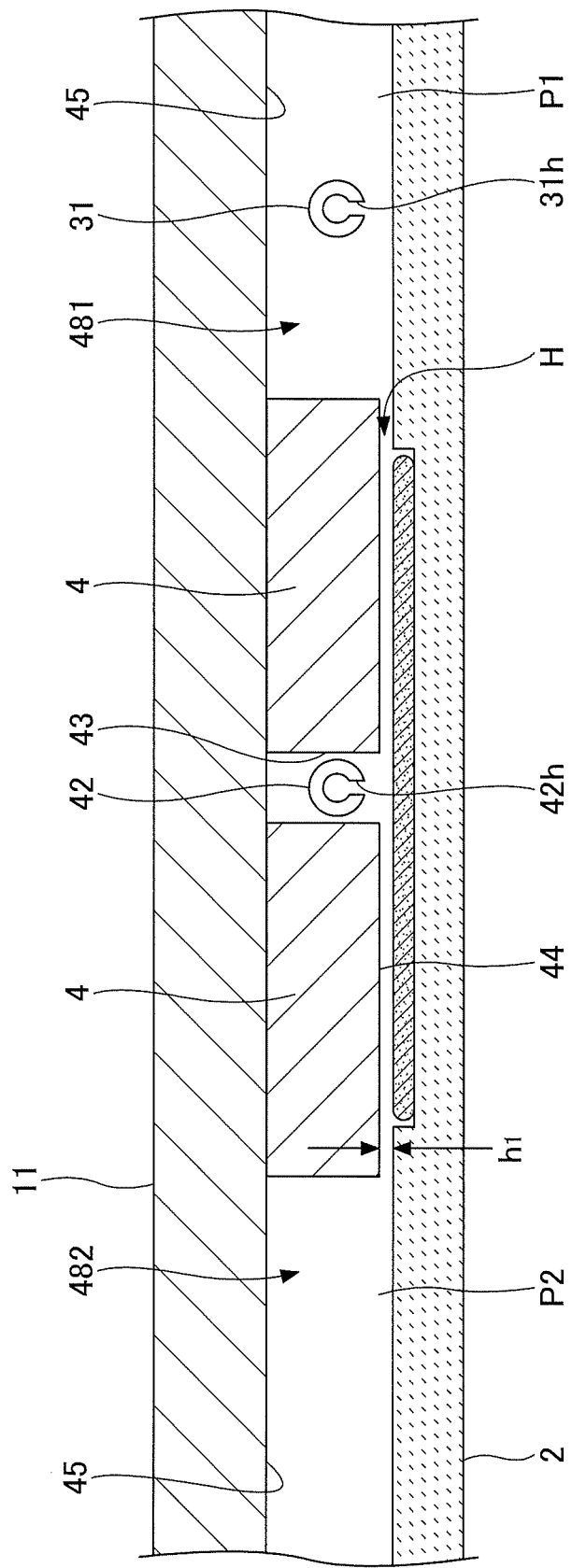
FIG. 4 is a cross-sectional view of a vacuum vessel taken along a circumferential direction of a rotary table.

FIG. 4 illustrates a cross-section of the vacuum vessel 1 along the concentric circle of the rotary table 2 from the first processing region P1 to the second processing region P2. As illustrated, because a projection 4 is attached to the back surface of the top plate 11, in the vacuum vessel 1, a flat low ceiling surface (hereinafter referred to as a "first ceiling surface 44"), which is a lower surface of the projection 4, and ceiling surfaces that are higher than the first ceiling surface 44 (hereinafter referred to as "second ceiling surfaces 45"), which are positioned on both sides of the first ceiling surface 44 in the circumferential direction, are formed. The first ceiling surface 44 has a fan-shaped planar shape, the narrowest part of which is cut in an arc. Also, as illustrated, at the center of the projection 4 in the circumferential direction, a groove 43 that extends radially is formed, and the separation gas nozzle 42 is housed in the groove 43. Similarly, a groove 43 is formed in the other projection 4, and the separation gas nozzle 41 is housed in the groove 43. The reactant gas nozzle 31 is provided in the space below the second ceiling surface 45 of the first processing region P1. In contrast, although the space below the second ceiling surface 45 of the second processing region P2 is maintained at a constant temperature, a gas nozzle is not provided and no gas is supplied. The reactant gas nozzle 31 is provided in the vicinity of the wafer W, which is spaced from the second ceiling surface 45. As illustrated in FIG. 4, the reactant gas nozzle 31 is provided in a space 481 below the second ceiling surface 45, and a gas nozzle is not provided in a space 482 below the second ceiling surface 45.

Multiple gas discharge holes 42h that open toward the rotary table 2 are arranged in the separation gas nozzle 42 accommodated in the groove 43 of the projection 4, along a longitudinal direction of the separation gas nozzle 42 at intervals of, for example, 2 mm. Although illustration is omitted, similar to the separation gas nozzle 42, multiple gas discharge holes opening toward the rotary table 2 are arranged in the separation gas nozzle 41 along a longitudinal direction of the separation gas nozzle 41 at intervals of, for example, 2 mm.

The first ceiling surface 44 forms a separation space H, which is a narrow space, above the rotary table 2. When Ar gas is supplied from the gas discharge hole 42h of the separation gas nozzle 42, Ar gas flows through the separation space H toward the spaces 481 and 482. Because the volume of the separation space H is smaller than a volumes of the spaces 481 and 482, when Ar gas flows, the pressure in the separation space H can be increased compared to the pressure in the spaces 481 and 482. That is, the high pressure separation space H is formed between the space 481 and the space 482. Also, the Ar gas flowing from the separation space H into the spaces 481 and 482 acts as a counterflow against an inflow of $Si_2H_6$ gas from the first processing region P1 into the second processing region P2. Therefore, the $Si_2H_6$ gas from the first processing region P1 is separated by the separation space H so as not to flow into the second processing region P2. Therefore, in the vacuum vessel 1, because $Si_2H_6$ gas is prevented from moving into the second processing region P2 that is stably maintained at a high temperature without entry of gas, occurrence of a CVD reaction is suppressed.

The height h1 of the first ceiling surface 44 relative to the upper surface of the rotary table 2 is set to a height suitable for increasing the pressure in the separation space H compared to the pressure in the spaces 481 and 482, in consideration of the pressure in the vacuum vessel 1, the rotational speed of the rotary table 2, the flow rate of a separation gas supplied, and the like when forming the film.

Meanwhile, as illustrated in FIGS. 2 and 3, on the lower surface of the top plate 11, a protrusion 5 is provides so as to surround the outer circumference of the core 21 that fixes the rotary table 2. In the present embodiment, the protrusion 5 is continuous with a portion of the projection 4 on a side of the rotational center, and the lower surface of the protrusion 5 is formed at the same height as the first ceiling surface 44.

FIG. 1, which has been referred to above, is a cross-sectional view taken along the I-I' line in FIG. 3, and illustrates an area in which the second ceiling surface 45 is provided.

Figure 5:
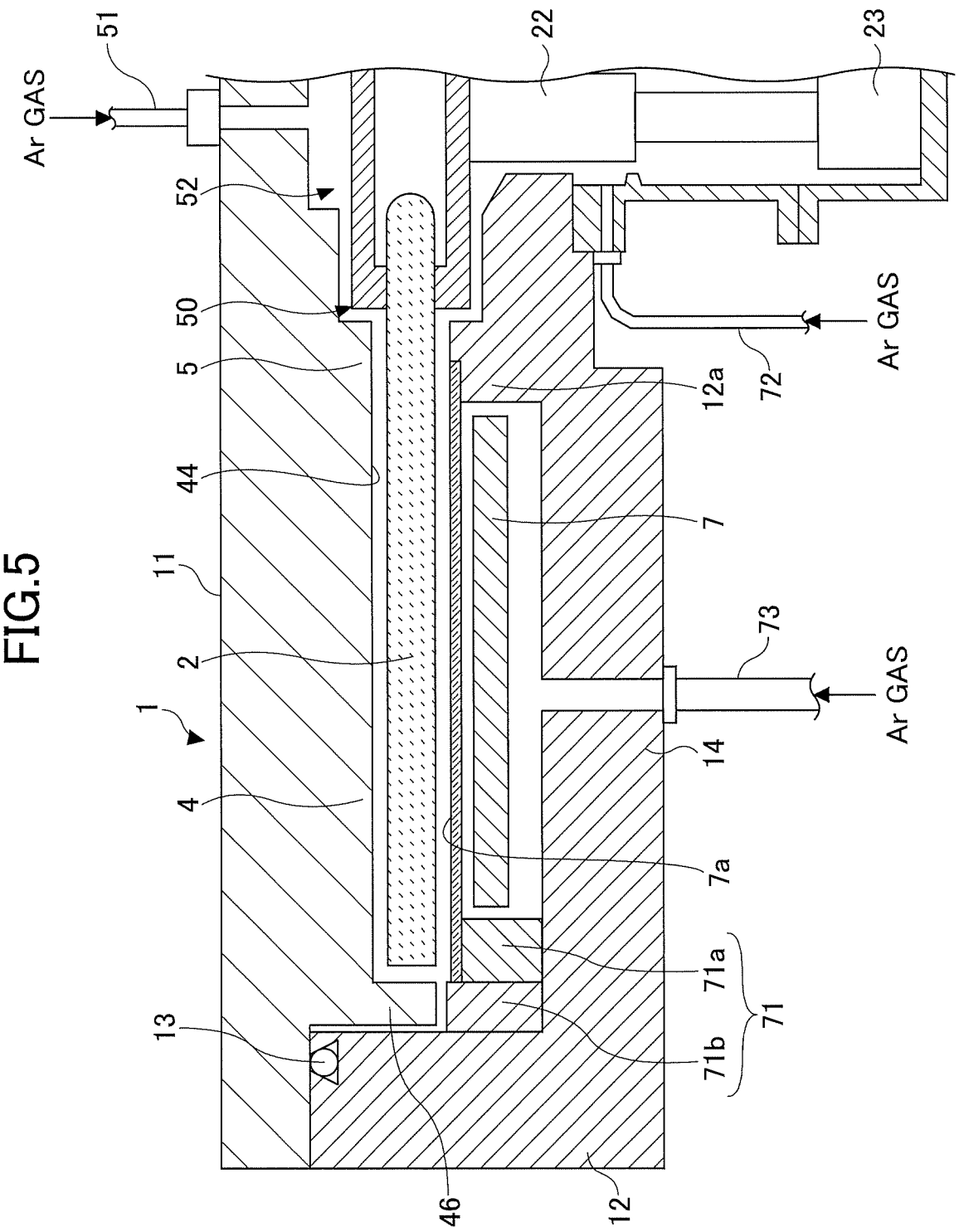
FIG. 5 is a cross-sectional view of the vacuum vessel taken along a radial direction of the rotary table.

In contrast, FIG. 5 is a cross-sectional view illustrating an area in which the first ceiling surface 44 is provided. As illustrated in FIG. 5, at an outer periphery of the fan-shaped projection 4, an L-shaped bent portion 46 is formed such that the bent portion 46 faces an outer edge of the rotary table 2. Similar to the projection 4, the bent portion 46 prevents a reactant gas from entering the separation region D from the first processing region P1, and thereby suppresses occurrence of a CVD reaction. As the fan-shaped projection 4 is provided on the top plate 11 and the top plate 11 can be removed from the vessel body 12, there is a slight gap between the outer peripheral surface of the bent portion 46 and the vessel body 12. A gap between the inner peripheral surface of the bent portion 46 and the outer edge of the rotary table 2 and the gap between the outer peripheral surface of the bent portion 46 and the vessel body 12 are set to a dimension similar to, for example, the height of the first ceiling surface 44 relative to the upper surface of the rotary table 2.

In the first separation region D1 and the second separation region D2, the inner circumferential wall of the vessel body 12 is formed to be straight in a vertical direction and is close to the outer circumferential wall of the bent portion 46, as illustrated in FIG. 5. In contrast, with respect to a portion other than the first separation region D1 and the second separation region D2, the inner circumferential wall of the vessel body 12 is recessed outwardly from a location facing the outer edge of the rotary table 2 toward the bottom 14, for example, as illustrated in FIG. 1. Hereinafter, for the sake of explanation, the recessed portion having a generally rectangular cross-sectional shape is referred to as an exhaust region E. Specifically, as illustrated in FIG. 3, the exhaust region communicating with the first processing region P1 is referred to as a first exhaust region E1, and the exhaust region communicating with the second and third processing regions P2 and P3 is referred to as a second exhaust region E2. At the respective bottoms of these first and second exhaust regions E1 and E2, a first exhaust port 61 and a second exhaust port 62 are formed respectively, as illustrated in FIGS. 1 to 3. The first exhaust port 61 and the second exhaust port 62 are each connected to an exhaust device such as a vacuum pump 64 via an exhaust pipe 63, as illustrated in FIG. 1. The exhaust pipe 63 is provided with a pressure controller 65.

Figure 6:
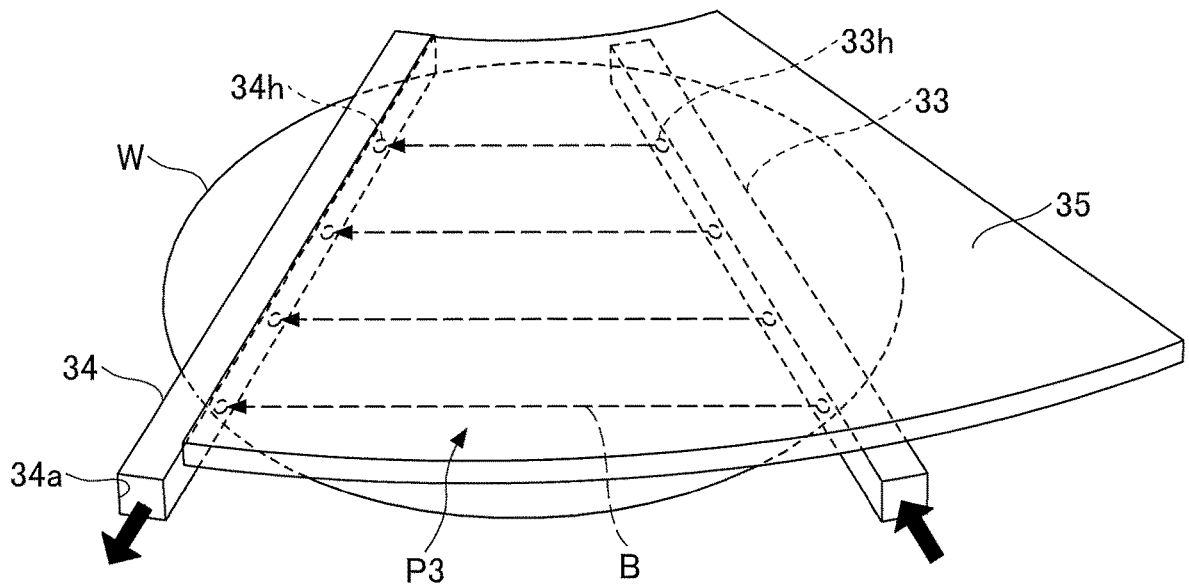
FIG. 6 is a diagram for explaining a third processing region of the deposition apparatus in FIG. 1.

FIG. 6 is a diagram for explaining the third processing region P3 of the deposition apparatus illustrated in FIG. 1. As illustrated in FIG. 6, multiple gas discharge holes 33h opening toward the downstream side (rotational direction of the rotary table 2) are arranged on the reactant gas nozzle 33, along the longitudinal direction of the reactant gas nozzle 33 at an interval of 10 mm, for example. Accordingly, chlorine radicals discharged from the gas discharge holes 33h of the reactant gas nozzle 33 flow along the rotational direction of the rotary table 2 as indicated by the arrow B of FIG. 6.

On the downstream side relative to the reactant gas nozzle 33, more particularly, on the downstream side of the straightening plate 35, an exhaust duct 34 is provided. The exhaust duct 34 is provided so as to extend radially along the rotary table 2, from a position outside the rotary table 2 toward the center of the rotary table 2. On the exhaust duct 34, multiple exhaust holes 34h that open toward the upstream side relative to the exhaust duct 34, i.e., toward the side at which the reactant gas nozzle 33 is disposed, are arranged along the longitudinal direction of the exhaust duct 34 at an interval of 10 mm, for example. At an outer end of the exhaust duct 34 in the radial direction, an opening 34a is formed. Accordingly, chlorine radicals, which are supplied from the reactant gas nozzle 33 and which flow along the rotational direction of the rotary table 2, can be directly exhausted, and it is possible to maintain the lateral parallel flow. In other words, chlorine radicals flow substantially parallel to the surface of the wafer W. Therefore, with respect to a wafer W having a recess on its surface, as chlorine radicals easily reach the upper portion of the inner wall of the recess, etching action by chlorine radicals easily occurs. In contrast, as chlorine radicals do not appreciably reach the lower portion of the inner wall of the recess and the bottom surface of the recess, there is almost no etching effect by chlorine radicals. As a result, silicon atomic layers on the upper inner wall of the recess are selectively removed.

Referring again to FIG. 5, as also described in FIG. 1, the heater unit 7 is provided in the space between the rotary table 2 and the bottom 14 of the vacuum vessel 1. In the deposition apparatus according to the present embodiment, a wafer W on the rotary table 2 is heated through the rotary table 2, to a temperature (e.g., 550° C.) at which the Si—H bond of an SiH$_3$ molecular layer formed on the surface of the wafer W can be broken. In the present embodiment, the temperature at which an Si—H bond can be broken may also be referred to as a "first temperature". Below the rotary table 2, a cover member 71 is provided near the circumferential edge of the rotary table 2. The cover member 71 has a ring shape, and separates an atmosphere extending from a space above the rotary table 2 to the first exhaust region E1 and the second exhaust region E2, from an atmosphere in which the heater unit 7 is disposed, to prevent gas from entering the lower area of the rotary table 2. The cover member 71 includes an inner member 71a disposed at an area under the outer edge of the rotary table 2 and under a periphery of the outer edge of the rotary table 2, and includes an outer member 71b disposed between the inner member 71a and the inner circumferential wall of the vacuum vessel 1. In the first separation region D1 and the second separation region D2, the outer member 71b is provided below the bent portion 46 formed at the outer edge of the projection 4, in proximity to the bent portion 46. The inner member 71a surrounds the heater unit 7 throughout its entire circumference, under the outer edge of the rotary table 2 (and slightly outside the outer edge).

A portion of the bottom 14 closer to the rotational center relative to the space accommodating the heater unit 7 extends upward toward a portion of the core 21 near the center of the bottom surface of the rotary table 2, to form an extending portion 12a. The space between the extending portion 12a and the core 21 is narrow, and the gap between the rotating shaft 22 passing through the bottom 14 and an inner peripheral wall of a through-hole for the rotating shaft 22 is also narrow. These narrow spaces communicate with the casing 20. The casing 20 is provided with a purge gas supply line 72 for supplying Ar gas serving as a purge gas to purge from the narrow spaces. Also, at the bottom 14 of the vacuum vessel 1, multiple purge gas supply lines 73 are provided at predetermined angular intervals below the heater unit 7, in order to purge from the space accommodating the heater unit 7 (one of the purge gas supply lines 73 is illustrated in FIG. 5). In addition, a lid member 7a is provided between the heater unit 7 and the rotary table 2 such that the lid member 7a circumferentially covers an area from the inner peripheral wall (the upper surface of the inner member 71a) of the outer member 71b to the upper end of the extending portion 12a, in order to prevent gas from entering the region accommodating the heater unit 7. The lid member 7a may be made of, for example, quartz.

A separation gas supply line 51 is connected to the center of the top plate 11 of the vacuum vessel 1, and is configured to supply Ar gas, which is a separation gas, to a space 52 between the top plate 11 and the core 21. The separation gas supplied to the space 52 is discharged along the surface of the rotary table 2, on which a wafer is placed, toward the periphery, through a narrow gap 50 of the protrusion 5 and the rotary table 2. The gap 50 may be maintained at a pressure higher than the space 481 and the space 482 by the separation gas. Accordingly, the gap 50 prevents Si$_2$H$_6$ gas supplied to the first processing region P1 from entering the second processing region P2 through a central region C. That is, the gap 50 (or the central region C) functions in the same way as the separation space H (or the first separation region D1 or the second separation region D2).

Further, as illustrated in FIGS. 2 and 3, the side wall of the vacuum vessel 1 is provided with a conveying port 15 for transferring a wafer W between an external transfer arm 10 and the rotary table 2. The conveying port 15 is opened and closed by a gate valve (not illustrated). In addition, when the recess 24, which is a wafer mounting area in the rotary table 2, is positioned at a location facing the conveying port 15, a wafer W is received from the transfer arm 10 to the recess 24, or is passed to the transfer arm 10 from the recess 24. Accordingly, lift pins and a lifting mechanism (not illustrated) for lifting the wafer W from the back surface through the recess 24 are provided below the rotary table 2 at a location corresponding to a wafer receiving position.

In addition, a controller 100 is provided in the deposition apparatus according to the present embodiment, as illustrated in FIG. 1. The controller 100 controls each part of the deposition apparatus. The controller 100 may be, for example, a computer or the like. Further, a computer program for operating each part of the deposition apparatus is stored in a recording medium. Examples of the recording medium may include a flexible disk, a compact disc, a hard disk, a flash memory, and a DVD.

<Deposition Method>

Figure 7:
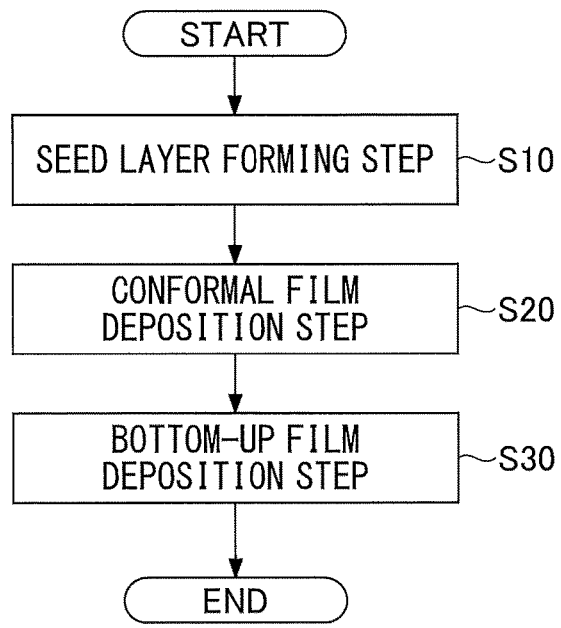
FIG. 7 is a flowchart illustrating an example of a deposition method according to the embodiment.

A deposition method according to the present embodiment will be described with reference to an example in which the aforementioned deposition apparatus is used. FIG. 7 is a flowchart illustrating an example of the deposition method according to the present embodiment. The deposition method according to the present embodiment includes a seed layer forming step S10, a conformal film deposition step S20, and a bottom-up film deposition step S30.

Figure 8:
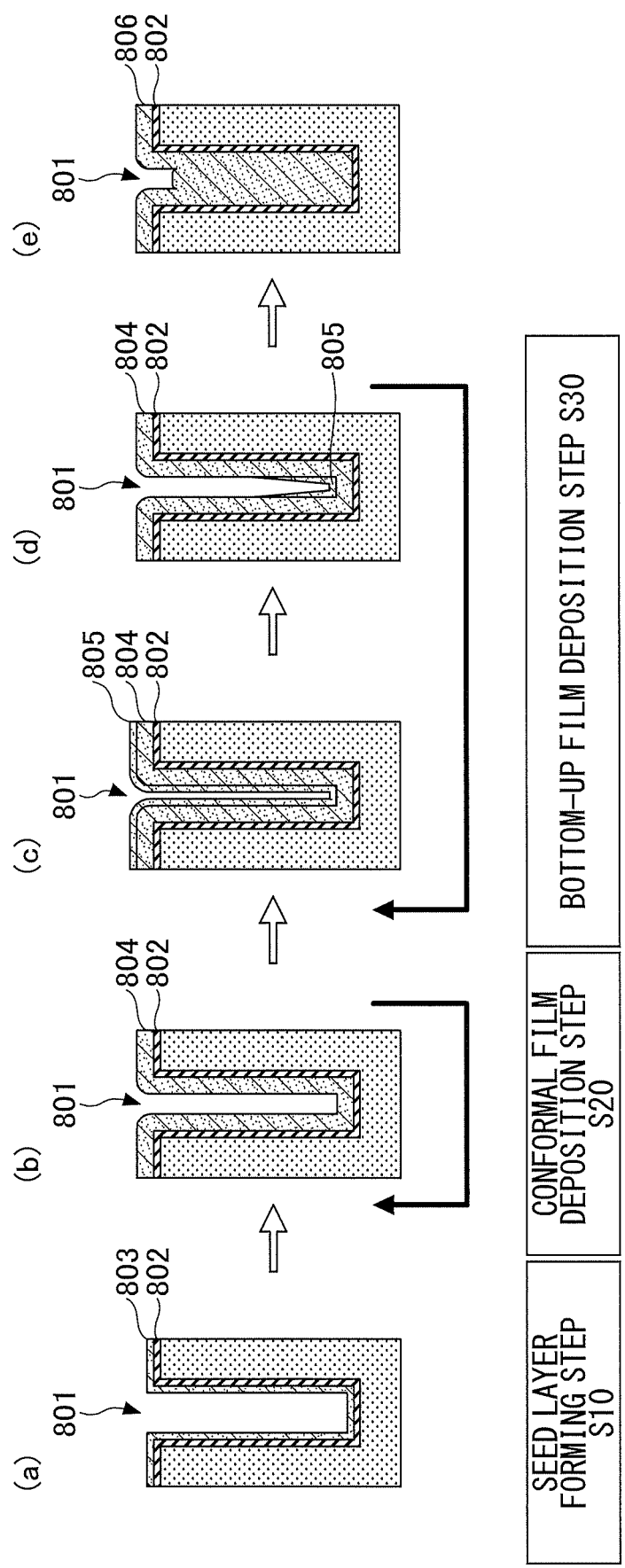
FIG. 8 is a set of cross-sectional views illustrating an example of the deposition method according to the embodiment.

FIG. 8 is a set of cross-sectional views illustrating an example of the deposition method according to the embodiment. In the example to be described below, a silicon wafer is used as the wafer W, and a recess, such as a trench or a via hole, is formed on the surface of the silicon wafer. It is assumed that a silicon oxide film is conformally formed in the recess. Further, a case in which DIPAS gas or $Si_2H_6$ gas is supplied from the reactant gas nozzle 31 and in which $Cl_2$ gas is supplied from the reactant gas nozzle 33 will be described. Also, the $Cl_2$ gas is radicalized by a remote plasma and is supplied as chlorine radicals.

First, the controller 100 opens the gate valve (not illustrated), and passes wafers W to the respective recesses 24 in the rotary table 2, from the outside, by using the transfer arm 10 (FIG. 3) through the conveying port 15 (FIGS. 2 and 3). A wafer W is passed to a recess 24 in the rotary table 2 by raising and lowering the lift pins (not illustrated) from the bottom side of the vacuum vessel 1 through the through-holes in the bottom surface of the recess 24 when the recess 24 stops at a position facing the conveying port 15. The controller 100 performs the above-described passing operations while intermittently rotating the rotary table 2, to place the wafers W into the respective five recesses 24 in the rotary table 2.

Subsequently, the controller 100 closes the gate valve, and evacuates the vacuum vessel 1 to an attainable vacuum level by the vacuum pump 64. Thereafter, the controller 100 causes Ar gas, which is a separation gas, to discharge from the separation gas nozzles 41 and 42 at a predetermined flow rate, and also causes Ar gas to discharge from the separation gas supply line 51 and the purge gas supply line 72 at a predetermined flow rate. At the same time, the controller 100 controls the inside of the vacuum vessel 1 to a preset processing pressure, by using the pressure controller 65 (FIG. 1). Then, the controller 100 heats the wafers W by the heater unit 7 to, for example, 550° C., while rotating the rotary table 2 clockwise at a rate of, for example, 5 to 20 rpm.

Subsequently, the controller 100 performs the seed layer forming step S10. In the seed layer forming step S10, the controller 100 causes DIPAS gas to be supplied from the reactant gas nozzle 31 of the first processing region P1. In the seed layer forming step S10, when a wafer W passes through the first processing region P1 by rotation of the rotary table 2, DIPAS gas is supplied to the wafer W. This causes the DIPAS gas to be adsorbed onto a surface of a silicon oxide film 802 formed in the recess 801, and a seed layer 803 is formed, as illustrated in the diagram (a) of FIG. 8. By forming the seed layer 803, incubation time is reduced, and thus time for deposition can be shortened. In the seed layer forming step S10, the rotary table 2 is rotated by a predetermined number of times until the seed layer 803 is formed on the surface of the silicon oxide film 802, and when the seed layer 803 is formed, the seed layer forming step S10 terminates, and supply of the DIPAS gas is stopped. The rotary table 2 continues to revolve while the wafers W are mounted. The seed layer forming step S10 is not essential, and may be performed if necessary.

Subsequently, the controller 100 performs the conformal film deposition step S20. In the conformal film deposition step S20, the controller 100 supplies $Si_2H_6$ gas from the reactant gas nozzle 31 of the first processing region P1. In the conformal film deposition step S20, when a wafer W passes through the first processing region P1 in accordance with the rotation of the rotary table 2, $Si_2H_6$ gas that is set at a second temperature lower than the first temperature (i.e., the temperature at which an Si—H bond can be broken) is supplied to the wafer W, and an $SiH_3$ molecular layer is formed on the surface of the seed layer 803. When the wafer W passes through the second processing region P2, the Si—H bond in the $SiH_3$ molecular layer is broken and a silicon atomic layer is exposed on the surface of the wafer W. Thus, as the wafer W repeatedly passes through the first processing region P1 and the second processing region P2 by rotating the rotary table 2, a silicon film 804 is conformally deposited on the silicon oxide film 802, as illustrated in the diagram (b) of FIG. 8.

Figure 9A:
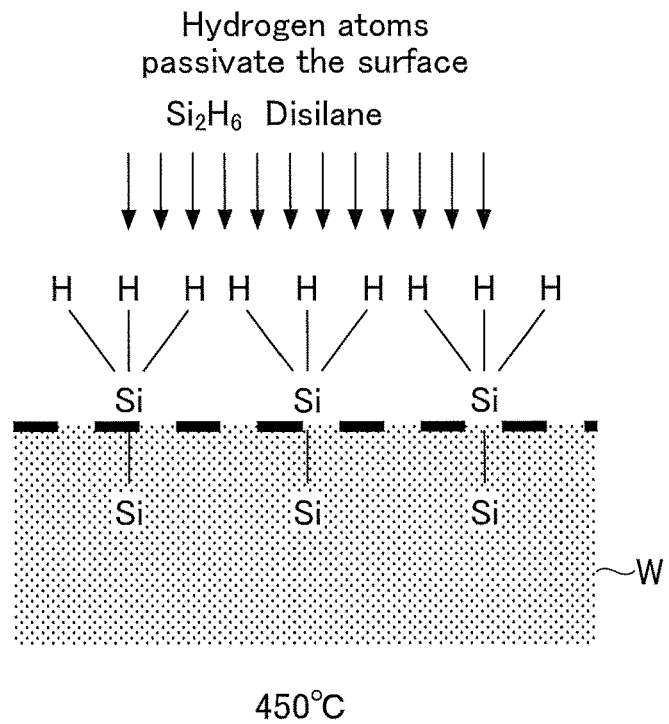
FIGS. 9A and 9B are diagrams for explaining a reaction mechanism in a conformal film deposition step.
Figure 9B:
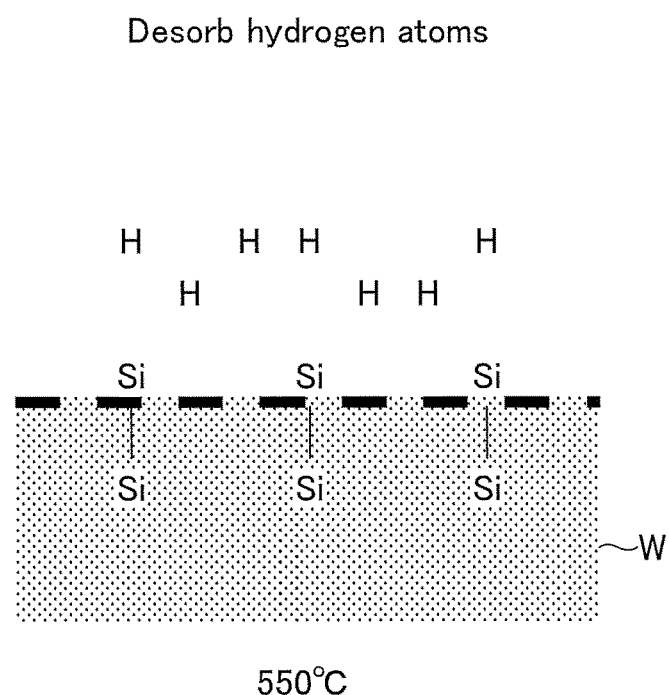

A reaction mechanism in the conformal film deposition step S20 will be described with reference to FIGS. 9A and 9B. FIGS. 9A and 9B are diagrams for explaining the reaction mechanism in the conformal film deposition step S20.

FIG. 9A illustrates an example of an $SiH_3$ molecular layer deposition step performed in the first processing region P1. In FIG. 9A, when $Si_2H_6$ gas is supplied, Si atoms of the $SiH_3$ molecular layer formed by pyrolyzing $Si_2H_6$ gas are adsorbed and bonded to the surface of the wafer W. That is, an $SiH_3$ molecular layer is formed on the surface of the wafer W by what is called an atomic layer deposition (ALD) method or a molecular layer deposition (MLD) method. Although such a reaction is generally referred to as an ALD method, $SiH_3$ is chemically not an atom but a molecule. Thus, in the present embodiment, a layer of $SiH_3$ is referred to as a molecular layer. Also, the ALD method and the MLD method are not strictly distinguished, and the above-described reaction is comprehensively referred to as the ALD method or the MLD method.

The above-described reaction typically occurs only under a condition in which bare silicon is present in an atmosphere of approximately 450° C. and thereby silicon can bind directly to each other. In the deposition apparatus according to the present embodiment, because the temperature in the vacuum vessel 1 is set to approximately 550° C., this ALD reaction cannot occur in a normal process. However, in the deposition method of the present embodiment, $Si_2H_6$ gas at a normal temperature is supplied from the reactant gas nozzle 31. The normal temperature is in a range between 20° C. and 30° C., and is typically approximately 25° C. Accordingly, by supplying $Si_2H_6$ gas at a normal temperature to the wafer W at a close distance, it is possible to instantaneously decrease the temperature in the vicinity of the surface of the wafer W, thereby instantly creating a temperature condition of 450° C. As illustrated in FIG. 4, in the first processing region P1, the second ceiling surface 45 is higher than the first ceiling surface 44 in the first separation region D1 and the second separation region D2, but the reactant gas nozzle 31 is positioned at the same height as the separation gas nozzle 42, and is close to the surface of the wafer W. Accordingly, $Si_2H_6$ gas supplied from the reactant gas nozzle 31 reaches the surface of the wafer W before the temperature of the $Si_2H_6$ gas reaches the temperature of the surrounding atmosphere, and a molecular layer deposition reaction (MLD), which can occur, in theory, only in an atmosphere of approximately 450° C., is caused to occur.

At the temperature of 550° C. in the vacuum vessel 1, a CVD reaction should occur in theory when $Si_2H_6$ gas is supplied. Therefore, even if $SiH_3$ is adsorbed onto the surface of the wafer W, an $SiH_3$ film may be further deposited on the $SiH_3$ molecular layer adsorbed onto the surface of the wafer W by the CVD reaction. However, in the deposition method of the present embodiment, because the rotary table 2 is rotated, the wafer W onto which the $SiH_3$ molecular layer is adsorbed is moved to the first separation region D1 without occurrence of an extra CVD reaction. In the first separation region D1, a purge gas of Ar is supplied in the narrow space and entry of $Si_2H_6$ gas is prevented.

Therefore, it is possible to prevent an SiH$_3$ film from being deposited, by a CVD reaction, on the surface of the SiH$_3$ molecular layer.

That is, in the deposition method according to the present embodiment, a condition is created in the first processing region P1, in which a molecular layer deposition reaction occurs instantaneously near the surface of a wafer W to form an SiH$_3$ molecular layer, and after the SiH$_3$ molecular layer is formed, the wafer W is rotated to the first separation region D1 before an extra CVD reaction would occur. By appropriately combining supply of Si$_2$H$_6$ gas at the normal temperature and rotational movement, even under a high temperature atmosphere in which an Si—H bond can be broken, an SiH$_3$ molecular layer deposition reaction, which occurs only in an atmosphere having a temperature lower than the temperature at which an Si—H bond can be broken, can be caused to occur, and an SiH$_3$ molecular layer can be formed.

In the first processing region P1, because an SiH$_3$ molecular layer is formed by the above-described molecular layer deposition reaction, the first processing region P1 may be referred to as a molecular layer deposition region, an SiH$_3$ adsorption region, an ALD region, or the like.

The present embodiment describes the example of supplying Si$_2$H$_6$ gas at a normal temperature. However, Si$_2$H$_6$ gas may be supplied at other temperatures, if the temperature of the Si$_2$H$_6$ gas is lower than 550° C. at which an Si—H bond can be broken. For example, the appropriate gas supply temperature can be set in the range of 0° C. to 50° C. in accordance with conditions.

In addition, in the first separation region D1, because of the structure described with reference to FIGS. 4 and 5, Si$_2$H$_6$ gas from the first processing region P1 can be prevented from flowing into the first separation region D1. Thus, the wafer W passes through the first separation region D1 while a purge gas such as Ar is supplied to the surface of the wafer W.

FIG. 9B illustrates an example of a hydrogen desorption step performed in the second processing region P2. As illustrated in FIG. 9B, in the second processing region P2, hydrogen desorption is accomplished by breaking the Si—H bond. This allows Si in the SiH$_3$ molecular layer to remain on the surface of the wafer W and to form a silicon atomic layer. In the second processing region P2, no gas is supplied to lower the temperature of the processing region, and the temperature is maintained at approximately 550° C., which is a temperature necessary for breaking an Si—H bond. By the rotation of the rotary table 2, the wafer W passes through the space of the second processing region P2 maintained at the predetermined temperature necessary for breaking an Si—H bond, thereby desorbing hydrogen and forming a bare silicon atomic layer.

At this time, the circumferential length of the second processing region P2 and the rotational speed of the rotary table 2 are determined so that an Si—H bond is broken while the wafer W passes through the second processing region P2. Generally, the first processing region P1 is formed as a short region so that a CVD reaction does not occur, whereas the second processing region P2 is formed as a longer region than the first processing region P1 so as to ensure that a hydrogen desorption reaction occurs.

The wafer W that has passed through the second processing region P2 moves to the third processing region P3 by rotation. At this time, because no chlorine radicals are supplied in the third processing region P3, an etching reaction does not occur.

The wafer W that has passed through the third processing region P3 moves to the second separation region D2 by rotation. In the second separation region D2, a purge gas, such as Ar, is supplied to the surface of the wafer W to prevent excess dust and the like from depositing on the surface of the silicon atomic layer.

The wafer W that has passed through the second separation region D2 enters the first processing region P1 again while the bare silicon film is formed, by further rotation of the rotary table 2, and an SiH$_3$ molecular layer is formed by the aforementioned molecular layer deposition method. Hereafter, the same processes are repeated. Then, by rotating the rotary table 2 several times continuously, the aforementioned silicon film deposition process can be repeated and a silicon film of a desired thickness can be formed conformally.

As described above, according to the conformal film deposition step S20, temperature setting in the vacuum vessel 1 in which an Si—H bond can be broken, supply of a disilane gas at a temperature lower than the temperature in which an Si—H bond can be broken, and prevention of occurrence of a CVD reaction by rotation of the rotary table 2, are appropriately combined. Accordingly, the temperature in the vacuum vessel 1 can be kept constant, and a highly uniform silicon film using the ALD method can be formed with high productivity.

Incidentally, although an example in which the temperature in the vacuum vessel 1 is approximately 550° C. has been described above, the present disclosure is not limited thereto. Because the heater unit 7 may be set such that the interior of the vacuum vessel 1 becomes a temperature at which breaking of an Si—H bond occurs, the heater unit 7 may be set such that the interior of the vacuum vessel 1 becomes a temperature at which breaking of an Si—H bond occurs, for example, in the range of 540° C. to 580° C.

Subsequently, the controller 100 executes the bottom-up film deposition step S30. In the bottom-up film deposition step S30, the controller 100 causes Si$_2$H$_6$ gas to be supplied from the reactant gas nozzle 31 of the first processing region P1, and causes chlorine radicals to be supplied from the reactant gas nozzle 33 of the third processing region P3.

In the bottom-up film deposition step S30, when a wafer W passes through the first processing region P1 by rotation of the rotary table 2, Si$_2$H$_6$ gas set at the second temperature lower than the first temperature is supplied to the wafer W, and an SiH$_3$ molecular layer is formed on the surface of the wafer W.

Also, when the wafer W passes through the second processing region P2, an Si—H bond in the molecular layer of SiH$_3$ is broken and a silicon atomic layer 805 is exposed on the surface, as illustrated in the diagram (c) of FIG. 8.

Further, when the wafer W passes through the third processing region P3, chlorine radicals are supplied to the wafer W from the reactant gas nozzle 33. The chlorine radicals easily reach the upper surface of the wafer W and an upper portion of the recess 801, to etch and remove many silicon atomic layers 805 on the upper surface of the wafer W and an upper portion of the recess 801. Meanwhile, because the recess 801 is deep, chlorine radicals do not reach the bottom surface of the recess 801, and the silicon atomic layer 805 on the bottom surface of the recess 801 is not appreciably etched. Thus, as illustrated in the diagram (d) of FIG. 8, the silicon atomic layer 805 on the bottom surface of the recess 801 and on a lower portion of the inner wall of the recess 801 remains, and the silicon atomic layer 805 on an upper portion of the inner wall of the recess 801 is selectively removed.

By rotation of the rotary table 2, as the wafer W repeatedly passes through the first processing region P1, the second processing region P2, and the third processing region P3, a bottom-up grown silicon film 806 with a V-shaped cross-sectional shape is deposited in the recess 801, as illustrated in the diagram (e) of FIG. 8. This prevents the opening in the upper portion of the recess 801 from being clogged, and allows embedding of a silicon film in the recess 801 while maintaining a condition in which voids or seams are not easily formed. In addition, because the silicon film 806 is formed by repeating forming of an SiH$_3$ molecular layer and exposing of the silicon atomic layer 805 by breaking Si—H bonds in the SiH$_3$ molecular layer, the fine and dense silicon film 806 can be formed.

Further, in the bottom-up film deposition step S30, because the chlorine radicals supplied from the reactant gas nozzle 33 easily reach a region on the surface of the rotary table 2, on which a wafer W is not placed, a film deposited on the surface of the rotary table 2 is removed by etching. As this can reduce cleaning frequency of the rotary table 2, productivity increases.

In the bottom-up film deposition step S30, chlorine radicals may be intermittently supplied from the reactant gas nozzle 33 of the third processing region P3. For example, by supplying chlorine radicals from the third processing region P3 for only every predetermined number of times the rotary table 2 is rotated, an etching amount of the silicon film can be reduced, and thereby a film deposition rate can be increased.

The embodiments disclosed herein should be considered to be exemplary in all respects and not restrictive. The above embodiments may be omitted, substituted, or modified in various forms without departing from the scope of the appended claims.

The above-described embodiment has described a case, as an example, in which chlorine gas is used as an etching gas supplied to the third processing region P3, but the present disclosure is not limited thereto. For example, fluorine (F$_2$) gas, trifluoromethane (CHF$_3$) gas may be used instead of chlorine gas. F$_2$ gas and CHF$_3$ gases are radicalized by remote plasma and supplied as fluorine radicals.

What is claimed is:

1. A method of depositing a silicon film on a recess formed in a surface of a substrate, which is placed on a rotary table and can pass through a first processing region, a second processing region, and a third processing region that are provided in a vacuum vessel separately from each other and are arranged along a circumferential direction in the vacuum vessel, an interior of the vacuum vessel being set to a first temperature at which an Si—H bond can be broken, the method comprising an embedding step of embedding the silicon film in the recess by continuously rotating the rotary table to cause the substrate to pass through the first processing region, the second processing region, and the third processing region, the embedding step including
    a) supplying Si$_2$H$_6$ gas having a second temperature less than the first temperature to the first processing region, thereby forming an SiH$_3$ molecular layer on the surface of the substrate when the substrate passes through the first processing region;
    b) causing a silicon atomic layer to be exposed, on the surface of the substrate, by breaking the Si—H bond in the SiH$_3$ molecular layer when the substrate passes through the second processing region; and
    c) supplying an etching gas to the third processing region to selectively remove the silicon atomic layer on an upper portion of an inner wall of the recess by anisotropic etching when the substrate passes through the third processing region,
    wherein the supplying of the etching gas is started after rotating the rotary table a predetermined number of rotations to perform a) and b), and
    wherein each rotation among the rotations comprises rotating the rotary table by 360 degrees.

2. The method according to claim 1, wherein the supplying of the etching gas is intermittently performed.

3. The method according to claim 2, further comprising a deposition step performed before the embedding step, wherein the deposition step includes a) and b), without including c).

4. The method according to claim 3, further comprising forming a seed layer on the surface of the substrate, the forming of the seed layer being performed before the deposition step.

5. The method according to claim 4, wherein the forming of the seed layer includes supplying an aminosilane-based gas on the surface of the substrate.

6. The method according to claim 1, wherein the anisotropic etching is performed by supplying chlorine radicals or fluorine radicals.

7. The method according to claim 6, wherein the chlorine radicals or the fluorine radicals are supplied such that the chlorine radicals or the fluorine radicals flow substantially parallel to the surface of the substrate.

8. The method according to claim 1, wherein
    the vacuum vessel includes a first separation region provided between the first processing region and the second processing region to separate the first processing region and the second processing region; and
    the embedding step includes supplying a purge gas onto the surface of the substrate by causing the substrate to pass through the first separation region, thereby suppressing occurrence of a CVD reaction of SiH$_3$, the supplying of the purge gas being performed after a).

9. The method according to claim 1, wherein
    the vacuum vessel includes a second separation region provided between the third processing region and the first processing region to separate the third processing region and the first processing region; and
    the embedding step includes supplying a purge gas onto the surface of the substrate by causing the substrate to pass through the second separation region, the supplying of the purge gas being performed after c).

10. The method according to claim 1, wherein the substrate is placed on the rotary table so as to be rotatable with respect to the rotary table.

\* \* \* \* \*